United States Patent
Wand

(10) Patent No.: US 9,488,676 B2
(45) Date of Patent: Nov. 8, 2016

(54) SENSOR SHIELD FOR AN ELECTRIC VEHICLE

(71) Applicant: FORD GLOBAL TECHNOLOGIES, LLC, Dearborn, MI (US)

(72) Inventor: Thomas Joseph Wand, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 273 days.

(21) Appl. No.: 14/249,827

(22) Filed: Apr. 10, 2014

(65) Prior Publication Data

US 2015/0293150 A1    Oct. 15, 2015

(51) Int. Cl.
*G01R 1/18* (2006.01)
*G01R 31/00* (2006.01)
*B60L 3/00* (2006.01)
*B60L 11/18* (2006.01)

(52) U.S. Cl.
CPC . *G01R 1/18* (2013.01); *B60L 3/00* (2013.01); *B60L 11/1861* (2013.01); *G01R 31/006* (2013.01); *B60L 2240/549* (2013.01); *B60L 2270/147* (2013.01); *Y02T 10/7005* (2013.01); *Y02T 10/705* (2013.01); *Y02T 10/7044* (2013.01)

(58) Field of Classification Search
CPC . B60K 6/28; B60L 11/1851; Y02T 10/7044; G01R 1/18
USPC ......................................................... 307/125
See application file for complete search history.

(56) References Cited

U.S. PATENT DOCUMENTS

| | | | | |
|---|---|---|---|---|
| 5,517,104 A | * | 5/1996 | Kawakami | G01R 15/183 324/117 R |
| 6,472,878 B1 | * | 10/2002 | Bruchmann | G01R 15/202 324/117 H |
| 6,515,468 B1 | * | 2/2003 | Morimoto | G01R 15/207 324/117 H |
| 6,699,067 B1 | * | 3/2004 | Zhao | H01R 12/7088 439/516 |
| 6,781,359 B2 | * | 8/2004 | Stauth | G01R 15/202 324/117 H |
| 7,106,046 B2 | * | 9/2006 | Nagano | G01R 15/202 324/117 H |
| 7,142,434 B2 | * | 11/2006 | Beihoff | H02M 1/44 174/51 |
| 7,538,540 B2 | | 5/2009 | Tsukamoto | |

(Continued)

OTHER PUBLICATIONS

Racz, R. (2011). A novel contactless current sensor HEV/EV and renewable energy applications. Retrieved from http://www.digikey.com/en-US/articles/techzone/2011/may/a-novel-contactless-current-sensor-hevev-and-renewable-energy-applications.

*Primary Examiner* — Adrian S Wilson
(74) *Attorney, Agent, or Firm* — Carlson, Gaskey & Olds, P.C.

(57) ABSTRACT

An example electric vehicle component includes a current sensor shield that blocks magnetic fields of a contactor from influencing a current sensor. An example method of improving current sensor measurements includes blocking magnetic fields moving from a contactor toward the current sensor.

20 Claims, 5 Drawing Sheets

(56) References Cited

U.S. PATENT DOCUMENTS

| | | | |
|---|---|---|---|
| 7,583,072 B2* | 9/2009 | Muraki | G01R 15/207 324/117 H |
| 7,663,358 B2* | 2/2010 | Hashio | G01R 15/207 264/254 |
| 7,919,203 B2* | 4/2011 | Shibuya | H01M 2/105 429/149 |
| 8,987,948 B2* | 3/2015 | Simper | 307/125 |
| 2001/0019321 A1* | 9/2001 | Brooksby | G01D 4/004 345/87 |
| 2004/0080308 A1* | 4/2004 | Goto | G01R 19/0092 324/117 H |
| 2006/0022664 A1* | 2/2006 | Hill | G01R 1/18 324/750.27 |
| 2008/0186021 A1* | 8/2008 | Hashio | G01R 15/207 324/225 |
| 2010/0301835 A1* | 12/2010 | Kasajima | G01R 15/207 324/117 R |
| 2012/0244398 A1* | 9/2012 | Youngs | B60K 6/28 429/61 |
| 2013/0014983 A1* | 1/2013 | Korson | H05K 9/0024 174/378 |
| 2013/0057273 A1 | 3/2013 | Ide | |
| 2013/0065108 A1 | 3/2013 | Callicoat et al. | |
| 2013/0169267 A1 | 7/2013 | Miyakoshi et al. | |
| 2013/0214593 A1* | 8/2013 | Ohashi | G01R 15/207 307/10.1 |
| 2013/0335076 A1 | 12/2013 | Sakamoto et al. | |
| 2014/0055904 A1* | 2/2014 | Kamor | H01H 71/125 361/115 |
| 2015/0072188 A1* | 3/2015 | Dulle | B60R 16/03 429/61 |
| 2015/0231975 A1* | 8/2015 | Ishii | B60L 11/08 307/10.1 |

* cited by examiner

SENSOR SHIELD FOR AN ELECTRIC VEHICLE

BACKGROUND

This disclosure relates generally to shielding components of an electrified vehicle and, more particularly, shielding a sensor, such as a current sensor.

Example vehicles include hybrid electric vehicles (HEVs), and plug-in hybrid electric vehicles (PHEVs). Generally, hybrid vehicles differ from conventional motor vehicles because hybrid vehicles are selectively driven using a battery-powered electric machine. Conventional motor vehicles, by contrast, rely exclusively on an internal combustion engine to drive the vehicle.

Electric vehicles often include various sensors. One such sensor, a current sensor, measures current. Current measurements from the current sensor can be used to, for example, help determine a state of charge for a battery of the electric vehicle. Inaccurate sensor measurements are undesirable.

SUMMARY

An electric vehicle component according to an exemplary aspect of the present disclosure includes, among other things, a current sensor shield that blocks magnetic fields of a contactor from influencing a current sensor.

In a further non-limiting embodiment of the foregoing component, the current sensor shield extends directly from a bus bar that electrically connects a first component of an electric vehicle to a second component of the electric vehicle.

In a further non-limiting embodiment of any of the foregoing components, the current sensor shield and the bus bar are portions of a common continuous structure.

In a further non-limiting embodiment of any of the foregoing components, the current sensor shield is a flange of the bus bar.

In a further non-limiting embodiment of any of the foregoing components, the flange extends transversely from a primary portion of the bus bar.

In a further non-limiting embodiment of any of the foregoing components, the flange is spaced apart from both the contactor and the current sensor.

In a further non-limiting embodiment of any of the foregoing components, the flange is a folded portion of the bus bar.

In a further non-limiting embodiment of any of the foregoing components, the flange and the bus bar comprise copper.

In a further non-limiting embodiment of any of the foregoing components, the current sensor shield is housed within the contactor.

In a further non-limiting embodiment of any of the foregoing components, the current sensor shield is disposed about at least three distinct sides of a coil of the contactor.

An electric vehicle assembly according to another exemplary aspect of the present disclosure includes a contactor, a bus bar electrically connected to the contactor, a current sensor to measure current on the bus bar, and a current sensor shield. The contactor generates magnetic fields and the current sensor shield blocks at least a portion of the magnetic fields from reaching the contactor.

In a further non-limiting embodiment of the foregoing assembly, a magnetic field emanates from the contactor toward the current sensor along a path, and the current sensor shield is disposed within the path.

In a further non-limiting embodiment of any of the foregoing assemblies, the path is a linear path.

In a further non-limiting embodiment of any of the foregoing assemblies, the contactor, bus bar, current sensor, and current sensor shield are housed within a bussed electric center (BEC).

In a further non-limiting embodiment of any of the foregoing assemblies, the contactor selectively breaks an electrical connection between a load and a high voltage battery of an electric vehicle.

In a further non-limiting embodiment of any of the foregoing assemblies, the current sensor shield is a flange extending directly from the bus bar.

In a further non-limiting embodiment of any of the foregoing assemblies, the current sensor shield is housed within the contactor.

A method of improving current sensor measurements according to yet another example aspect of the present disclosure includes, among other things, blocking magnetic fields moving from a coil of a contactor toward the current sensor.

In a further non-limiting embodiment of the foregoing method, the method includes blocking using a flange of a bus bar that is spaced from both the contactor and the current sensor.

In a further non-limiting embodiment of any of the foregoing methods, the method includes blocking by covering at least three sides of a coil within the contactor with a metallic plate.

The embodiments, examples and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

DESCRIPTION OF THE FIGURES

The various features and advantages of the disclosed examples will become apparent to those skilled in the art from the detailed description. The figures that accompany the detailed description can be briefly described as follows.

DETAILED DESCRIPTION

Figure 1:
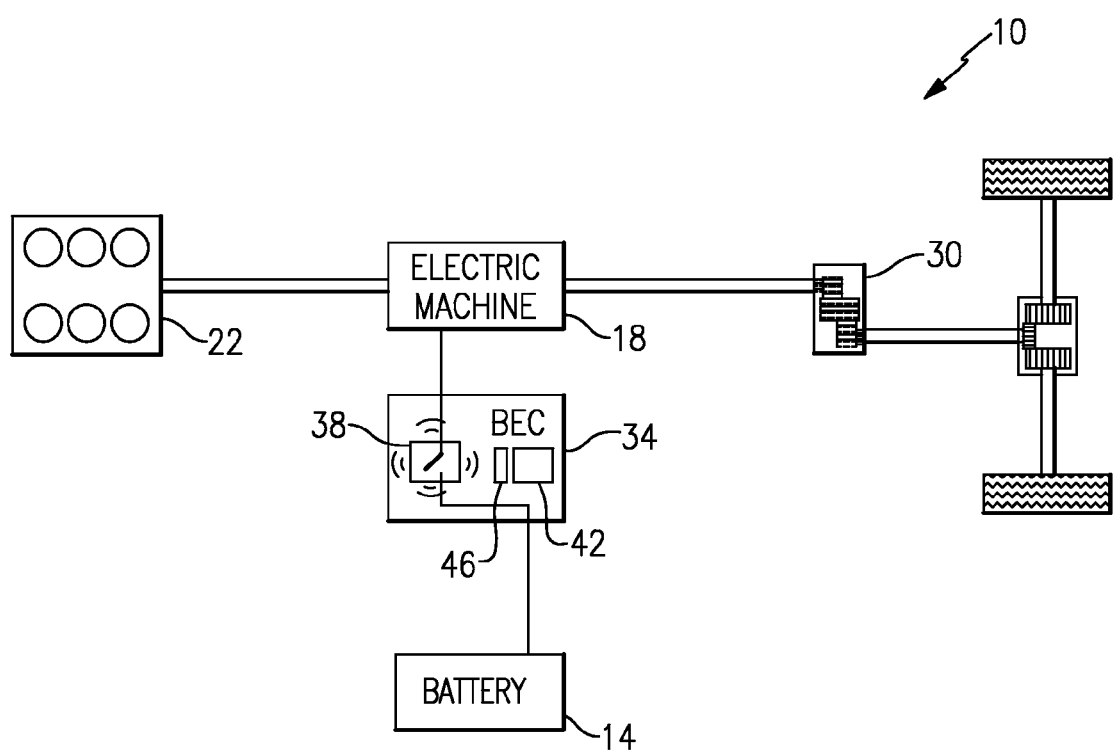
FIG. 1 shows a highly schematic view of an example hybrid powertrain for an electric vehicle.

Referring to FIG. 1, an example hybrid powertrain 10 for an electric vehicle includes a battery 14, an electric machine 18, and an internal combustion engine 22. The example powertrain 10 is incorporated into a hybrid electric vehicle (HEV). It should be understood, however, that the concepts described herein are not limited to HEVs and could extend to other vehicles including, but not limited to, plug-in hybrid electric vehicles (PHEVs), battery electric vehicles (BEVs), etc. The battery 14 is a relatively high voltage battery in this example.

In an example embodiment, the powertrain 10 employs a first drive system and a second drive system. The first drive system includes a combination of at least the electric machine 18 and the battery 14. The first drive system can thus be considered an electric drive system of the powertrain 10. The second drive system includes a combination of the internal combustion engine 22 and the electric machine 18.

The first and second drive systems generate torque to drive one or more sets of vehicle drive wheels 26 through a transmission gearbox 30. When the first drive system is employed, a disconnect clutch (not shown) may operably disconnect the internal combustion engine 22 from the remaining portions of the powertrain 10. When the second drive system is employed, the disconnect clutch engages to operably connect the internal combustion engine 22 to the remaining portions of the powertrain 10. The disconnect clutch could remain engaged when the first or second drive system is employed to permit the internal combustion engine 22 to drive the electric machine 18 to charge the battery 14.

The electric machine 18 is a combined motor-generator in this example. In other examples, the electric machine includes a motor and a generator that is separate from the motor.

The powertrain 10 includes a bussed electrical center (BEC) 34 includes at least one contactor 38 and a current sensor 42. The contactor 38 is essentially a relay having a coil. The contactor 38 can be used to selectively break an electrical connection between the battery 14 and electrical loads associated with other portions of the powertrain 10. The contactor 38 could be a precharge contactor or one (of two or more) primary contactors within the BEC 34. The contactor could also be a charger contactor.

The current sensor 42 is used to measures current within the BEC 34. The current measurements from the current sensor 42 may be used to determine a state of charge of the battery 14, for example. The current sensor 42 continually senses current during operation.

The example contactor 38 generates magnetic fields. Measurements taken by the sensor 42 can be influenced by magnetic fields. Essentially, the current driving the contactor 38 can be sensed by the current sensor 42, which creates an offset or other type of error in the measured current.

The example BEC 34 includes a shield 46 to block at least some of the magnetic fields propagating toward the sensor 42 from the contactor 38 from reaching the sensor 42. The shield 46 lessens errors in the readings of the current sensor 42 without compromising packaging.

Figure 2:
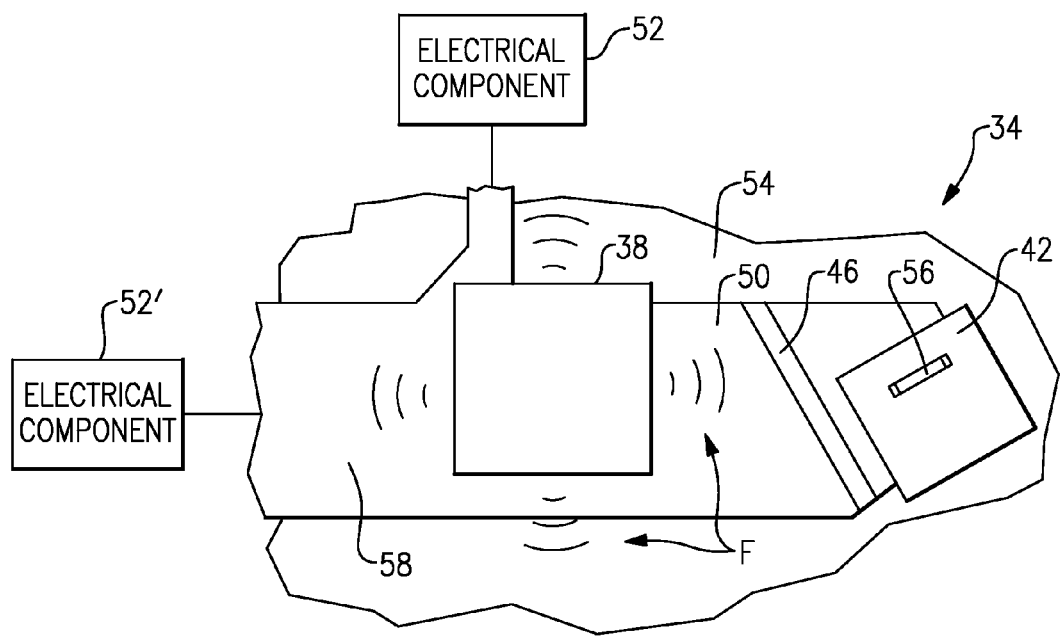
FIG. 2 shows a top view of a portion of a bussed electrical center of the powertrain of FIG. 1.
Figure 3:
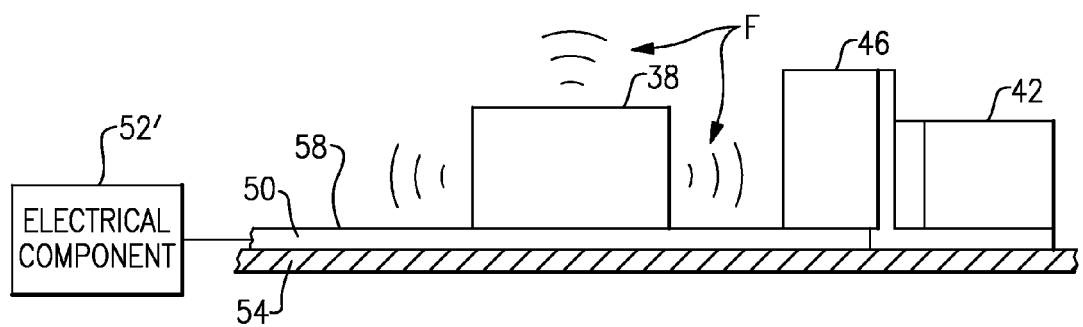
FIG. 3 shows a side view of the portion of FIG. 2.

Referring now to FIGS. 2 and 3 with continued reference to FIG. 1, the BEC 34 includes a bus bar 50 utilized to carry current. In this example, the bus bar 50 carries current between a first electrical component 52 and a second electrical component 52. Examples of the first electrical component 52 include a traction battery, safety disconnect, or fuse. Examples of the second component include a charger, fan, or a pump, and/or A/C Compressor driven by the HV Battery. Vehicle applications, and thus electrical components, can vary.

The bus bar 50 mounts to a floor 54 of the BEC 34. The contactor 38 and the current sensor 42 are both electrically connected to the bus bar 50.

As shown, the current sensor 42 is in relatively close proximity to the contactor 38. The example current sensor 42 receives a tab 56 extending upwardly from the bus bar 50. The current sensor 42 includes an aperture that receives the tab 56. During operation, the current sensor 42 senses current on the tab 56 and thus the current on the bus bar 50. The current sensor 42 has a ferrous core and hall effect sensors to sense current.

Magnetic fields F emanate from the contactor 38 during operation. Some of the magnetic fields F move directly toward the contactor 38 along a linear path. Magnetic fields F can undesirably influence measurements taken by the current sensor 42. The measurements taken by the current sensor 42 may have an offset or some other type of error in the measured current, for example.

The shield 46 blocks at least some of the magnetic fields F from reaching the sensor 42. The shield 46 significantly impedes the capability of the magnetic field F to pass from the contactor 38 to the current sensor 42.

In this example, the shield 46 is an upwardly extending flange disposed between the contactor 38 and the sensor 42, and spaced apart from both the contactor 38 and the sensor 42. The example shield 46 extends upwardly from a primary portion 58 of the bus bar 50. The primary portion 58 of the bus bar 50 is a planar portion of the bus bar 50 interfacing directly with the floor 54 or housing of the BEC 34.

In this example, the shield 46 and the bus bar 50 are portions of the same continuous structure. That is, the shield 46 is formed together with the bus bar 50.

The bus bar 50 and the shield 46 both comprises copper in this example. Copper facilitates carrying current.

In another example, the bus bar 50, the shield 46, or both, could be an alloy or a multilayer material including a layer of aluminum, for example, covered by a layer of another material. In a multilayer example, multiple sheets of various materials could be connected or bonded. The multilayer example of the bus bar 50 may include a copper sheet and sheets of other alloys or metals and aluminum. The copper sheet could be a plating of copper on another material.

Figure 4:
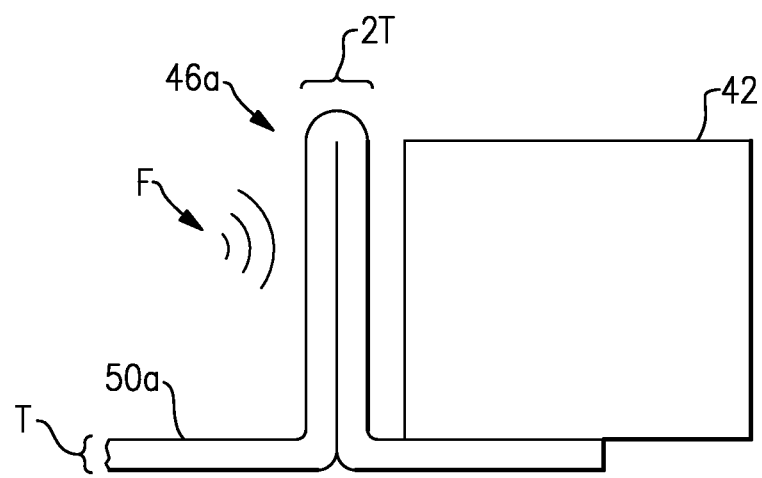
FIG. 4 shows another example current sensor shield.

Referring now to FIG. 4, an example shield 46*a* is a folded portion of a bus bar 50*a* formed from a planar sheet of material that has been is folded over itself. Since the shield 46*a* is essentially the bus bar 50*a* folded a single time, a thickness 2T of the shield 46*a* is about twice a thickness T of the bus bar 50*a*. Other shields may be folded more than once.

One of many types of manufacturing processes may be used to fold the bus bar 50A to form the shield 46A to protect the current sensor 42.

Figure 5:
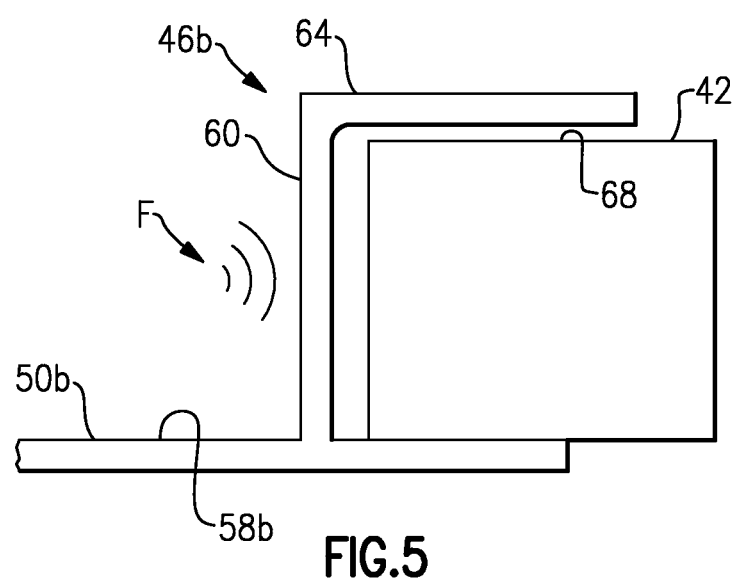
FIG. 5 shows yet another example current sensor shield.

Referring now to FIG. 5 with continued reference to FIG. 4, another example shield 46*b* includes a flange 60 extending directly from a primary portion 58*b* of the bus bar 50*b*. A second flange 64 extends from the flange 60 to cover a surface 68 of the sensor 42 facing upwards and away from the primary portion 58*b* of a bus bar 50*b*. Since the flange 60 extends across the surface 68 to wrap around the current sensor 42, the shield 46*b* may impede the magnetic field F more effectively than the shield 46*a*.

The shield 46*b* could be folded in a manner similar to the shield 46*a*. Alternatively, the shield 46*b* could be formed separately from the primary portion of the bus bar 50*b* and secured to the bus bar 50*b* with a weld, for example, or another fold.

The extension E could be an extrusion, such as a deep draw extrusion, from the bus bar 50*c* in some examples.

Figure 6A:
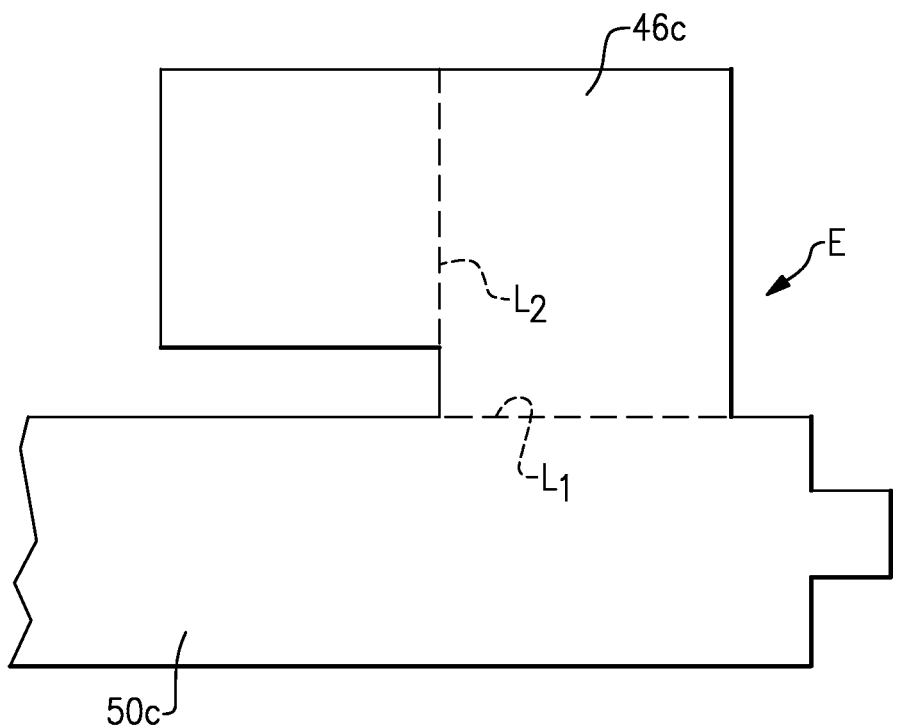
FIG. 6A shows a top view of yet another example sensor shield prior to folding.
Figure 6B:
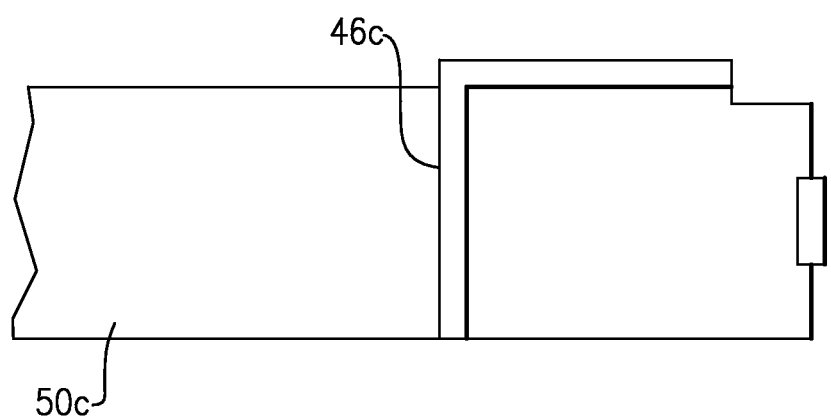
FIG. 6B shows the sensor shield of FIG. 6A after folding.

Referring now to FIGS. 6A and 6B, another example shield 46*c* of a bus bar 50*c* is formed from an extension off of a side of the bus bar 50*c*. The extension E is folded along fold lines $L_1$ and $L_2$. The folds are ninety degree folds in this example. The extension E is sliced off of the bus bar 50*c* in some examples.

The bus bar 50c may further include a stabilization tab 68 to help secure the sensor (not shown in this example).

Figure 7:
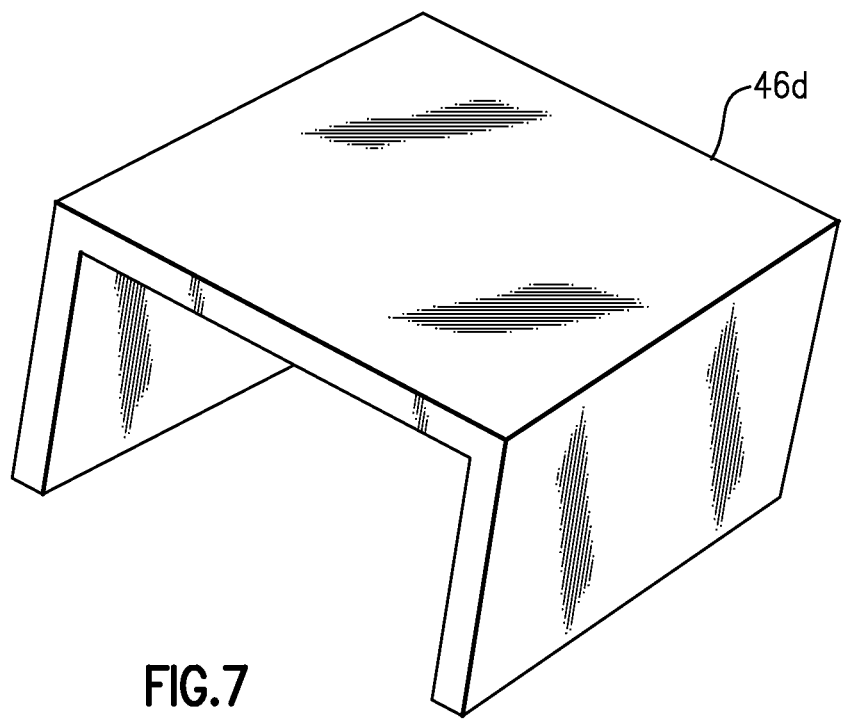
FIG. 7 shows a perspective view of yet another example current sensor shield.
Figure 8:
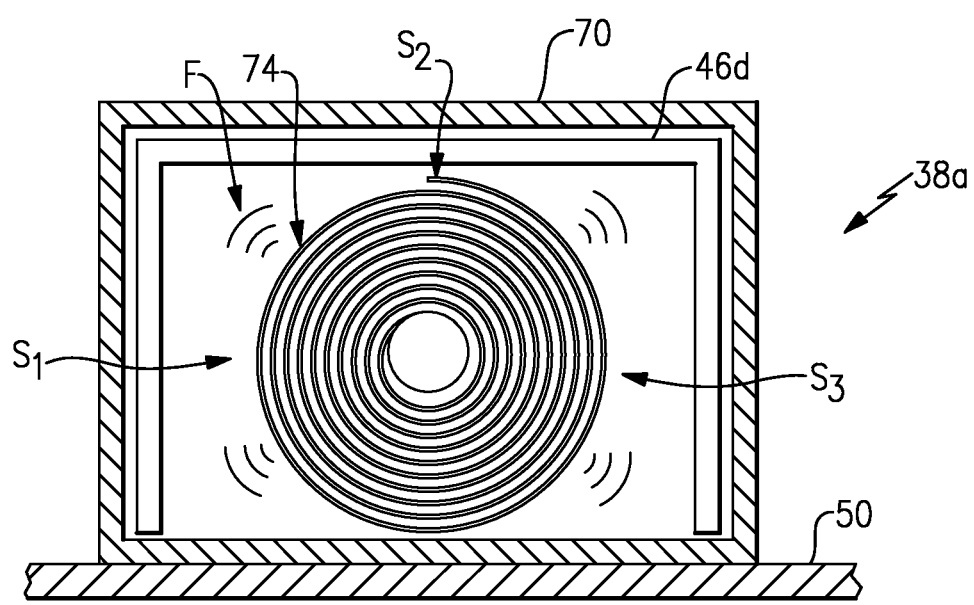
FIG. 8 shows the current sensor shield of FIG. 6 incorporated into a contactor.

Referring now to FIGS. 7 and 8, yet another example shield 46d is utilized more closely to a contactor 38a than the shields 46-46c. In this example, the shield 46d is housed within the contactor 38a between a housing 70 and a coil 74. The shield 46d could also be outside the housing 70 in some examples. The magnetic fields propagate from the coil 74. This positioning of the shield 46d thus provides shielding.

The shield 46d covers at least three distinct outwardly facing sides $S_1$, $S_2$, $S_3$, of the coil 74 within the contactor 38a. Side $S_1$ faces in an opposite direction from side $S_2$. The shield 46c extends continuously from side $S_1$ to side $S_2$ to side $S_3$.

The housing 70 holds the shield 46d in position. The housing 70 may be a plastic housing that is welded.

In the prior art, contactors have included metallic structures, like steel frames, within a housing, yet these metallic structures have not provided significant and appropriate shielding of magnetic fields F emanating from the coils 74 of the contactor 38. The shield 46d can be, in some examples, a continuation of steel frame within the housing 70 that provides desirable shielding by covering at least three sides of the coil 74.

Any of the above-described example shields could be made thinner to reduce weight and conserve material. The shields could also include apertures to reduce weight. The apertures could be sized such that the shields still appropriately block the fields F.

The above-described example shields could also be encased in an insulating cover or coating to protect against shorting against portions of the BEC.

The preceding description is exemplary rather than limiting in nature. Variations and modifications to the disclosed examples may become apparent to those skilled in the art that do not necessarily depart from the essence of this disclosure. Thus, the scope of legal protection given to this disclosure can only be determined by studying the following claims.

I claim:

1. An electric vehicle component, comprising:
   a current sensor shield that blocks magnetic fields of a contactor from influencing a current sensor, the current sensor shield extending directly from a bus bar that electrically connects a first component of an electric vehicle to a second component of the electric vehicle.

2. The component of claim 1, wherein the current sensor shield and the bus bar are portions of a common continuous structure.

3. The component of claim 1, wherein the current sensor shield is a flange of the bus bar.

4. The component of claim 3, wherein the flange extends transversely from a primary portion of the bus bar.

5. The component of claim 3, wherein the flange is spaced apart from both the contactor and the current sensor.

6. The component of claim 3, wherein the flange is a folded portion of the bus bar.

7. The component of claim 3, wherein the flange and the bus bar comprise copper.

8. The component of claim 1, wherein the current sensor shield is partially housed within the contactor.

9. The component of claim 8, wherein the current sensor shield is disposed about at least three distinct sides of a coil of the contactor.

10. An electric vehicle assembly, comprising:
    a contactor;
    a bus bar electrically connected to the contactor;
    a current sensor to measure current on the bus bar; and
    a current sensor shield, wherein the contactor generates magnetic fields and the current sensor shield blocks at least a portion of the magnetic fields from reaching the contactor, wherein the current sensor shield is a flange extending directly from the bus bar.

11. The assembly of claim 10, wherein a magnetic field emanates from the contactor toward the current sensor along a path, and the current sensor shield is disposed within the path.

12. The assembly of claim 11, wherein the path is a linear path.

13. The assembly of claim 10, wherein the contactor, bus bar, current sensor, and current sensor shield are housed within a bussed electric center (BEC).

14. The assembly of claim 10, wherein the contactor selectively breaks an electrical connection between a load and a high voltage battery of an electric vehicle.

15. The assembly of claim 10, wherein the current sensor shield is housed within the contactor.

16. A method of improving current sensor measurements, comprising:
    blocking magnetic fields moving from a coil of a contactor toward the current sensor; and
    using a flange of a bus bar that is spaced from both the contactor and the current sensor for the blocking.

17. The method of claim 16, further comprising blocking by covering at least three sides of a coil within the contactor with a metallic plate.

18. The component of claim 1, wherein the current sensor is configured to detect current in the bus bar.

19. The assembly of claim 10, wherein the current sensor is configured to detect current in the bus bar.

20. The method of claim 16, wherein the current sensor is configured to detect current in the bus bar.

* * * * *